(12) United States Patent
Sargent

(10) Patent No.: US 6,731,850 B1
(45) Date of Patent: May 4, 2004

(54) SINGLE-WAVEGUIDE INTEGRATED WAVELENGTH DEMUX PHOTODETECTOR AND METHOD OF MAKING IT

(75) Inventor: Edward H. Sargent, Toronto (CA)

(73) Assignee: Fox-Tek, Ontario (CA)

( * ) Notice: Subject to any disclaimer, the term of this patent is extended or adjusted under 35 U.S.C. 154(b) by 0 days.

(21) Appl. No.: 09/988,031

(22) Filed: Nov. 16, 2001

(51) Int. Cl.[7] .................................................. G02B 6/10
(52) U.S. Cl. ............................. 385/131; 385/8; 372/23; 372/50
(58) Field of Search ............................. 385/131, 31, 8; 372/23, 43, 44, 50; 359/180

(56) References Cited

U.S. PATENT DOCUMENTS

| | | | |
|---|---|---|---|
| 4,805,179 A | 2/1989 | Harder et al. | |
| 4,871,690 A | 10/1989 | Holonyak, Jr. et al. | |
| 5,298,454 A | 3/1994 | D'Asaro et al. | |
| 5,353,295 A | 10/1994 | Holonyak, Jr. et al. | |
| 5,384,797 A | 1/1995 | Welch et al. | 372/23 |
| 5,395,793 A | 3/1995 | Charbonneau et al. | |
| 5,425,043 A | 6/1995 | Holonyak, Jr. et al. | |
| 5,455,429 A | 10/1995 | Paoli et al. | |
| 5,539,763 A | 7/1996 | Takemi et al. | |
| 5,574,745 A | 11/1996 | Paoli et al. | |
| 5,608,753 A | 3/1997 | Paoli et al. | |
| 5,699,375 A | 12/1997 | Paoli | 372/50 |
| 5,707,890 A | 1/1998 | Emery et al. | |
| 5,708,674 A | 1/1998 | Beernink et al. | |
| 5,766,981 A | 6/1998 | Thornton et al. | |
| 5,771,256 A | 6/1998 | Bhat | |
| 5,784,507 A | * 7/1998 | Holm-Kennedy et al. | 385/31 |
| 5,843,802 A | 12/1998 | Beernink et al. | |
| 5,882,951 A | 3/1999 | Bhat | |
| 5,915,165 A | 6/1999 | Sun et al. | |
| 5,963,568 A | * 10/1999 | Paoli | 372/23 |
| 6,027,989 A | 2/2000 | Poole et al. | |
| 6,075,804 A | 6/2000 | Deppe et al. | 372/96 |

OTHER PUBLICATIONS

Journal of Crystal Growth (2000), "Growth of novel InP–based materials by He–plasma–assisted epitaxy," Authors: Pinkney et al.; pp. 237–241.

J. Vac. Sci. Technol. A 16(2), Mar/Apr 1998, "Characterization of annealed high–resistivity InP grown by He–plasma–assisted epitaxy," Authors: Pinkney et al.; pp. 772–775.

J. Vac. Sci. Technol. A 16(2), Mar/Apr 1998, "Quantum well intermixing in material systems for 1.5 $\mu$m (invited)," Authors: Marsh et al.; pp. 810–816.

IEEE Photonics Technology Letters, vol. 8, No. 9, Sep. 1996, "10 Gb/s Wavelength Conversion with Integrated Multiquantum–Well–Based 3–Port Mach–Zehnder Interferometer," Authors: Idler et al.; pp. 1163–1165.

J. Appl. Phys. 79(2), Jan. 15, 1996, "Compositional disordering of InGaAs/GaAs heterostructures by low–temperature–grown GaAs layers," Authors: Tsang et al.; pp. 664–670.

IEEE Photonics Technology Letters, vol. 7, No. 9, Sep. 1995, "Monolithic Integration of InGaAsP–InP Strained–Layer Distributed Feedback Laser and External Modulator by Selective Quantum–Well Interdiffusion," Authors: Ramdane et al.; pp. 1016–1018.

"Quantum Well Intermixing Caused By Non–Stoichiometric INP," Authors: Haysom et al.; pp. 56–59.

A. Ramdane et al, "Monolithic Integration of InGaAsP–InP Strained–Layer Distributed Feedback Laser and External Modulator by Selective Quantum–Well Interdiffusion," *IEEE Photonics Technology Letters*, vol. 7, No. 9, Sep., 1995, pp. 1016–1018.

* cited by examiner

*Primary Examiner*—Euncha Cherry
(74) *Attorney, Agent, or Firm*—Blank Rome LLP

(57) ABSTRACT

A photodetector has a spatially varying absorption spectrum formed in a monolithic InGaAsP structure whose quantum well active structure has modified effective bandgap properties. A waveguide couples light to the quantum well active structure. The spatially varying absorption spectrum allows wavelength-division demultiplexing. The effective bandgap properties can be modified by rapid thermal annealing to cause the diffusion of defects from one or two InP defect layers into the quantum well active structure.

19 Claims, 2 Drawing Sheets

SINGLE-WAVEGUIDE INTEGRATED WAVELENGTH DEMUX PHOTODETECTOR AND METHOD OF MAKING IT

FIELD OF THE INVENTION

The present invention is directed to a photodetector and more particularly to a photodetector having spatially varying wavelength absorption properties within a single semiconductor structure. The present invention is further directed to a method of making such a photodetector.

DESCRIPTION OF RELATED ART

High-speed networking is required both in local areas and at points of access to high-speed metropolitan-area networks. Active optical components are needed to detect optical signals on many wavelengths in a cost-effective manner. A very broad bandwidth needs to be addressed to take full advantage of emerging optical fiber technologies with low loss from 1300 to 1600 nm and beyond.

Traditional techniques for wavelength-division demultiplexing have used some sort of refracting or diffracting optical element to break up incoming signals by wavelength to apply the various wavelengths to multiple photodetectors. However, such techniques have resulted in devices which are expensive to manufacture.

U.S. patent application Ser. No. 09/833,078 to Thompson et al, filed Apr. 12, 2001, entitled "A method for locally modifying the effective bandgap energy in indium gallium arsenide phosphide (InGaAsP) quantum well structures," and published Mar. 14, 2002, as U.S. Ser. No. 2002/0030185 A1, whose entire disclosure is hereby incorporated by reference into the present disclosure, teaches a method for locally modifying the effective bandgap energy of indium gallium arsenide phosphide (InGaAsP) quantum well structures. That method allows the integration of multiple optoelectronic devices within a single structure, each comprising a quantum well structure.

In one embodiment, as shown in FIG. 1A, an InGaAsP multiple quantum well structure 104 formed on a substrate 102 is overlaid by an InP (indium phosphide) defect layer 106 having point defects 108, which are donor-like phosphorus antisites or acceptor-like indium vacancies. Rapid thermal annealing (RTA) is carried out under a flowing nitrogen ambient, using a halogen lamp rapid thermal annealing system. During the rapid thermal annealing, the point defects 108 in the defect layer 106 diffuse into the active region of the quantum well structure 104 and modify its composite structure. The controlled inter-diffusion process causes a large increase in the bandgap energy of the quantum well active region, called a wavelength blue shift.

Another embodiment, as shown in FIG. 1B, uses two defect types, one to generate a wavelength blue shift and the other to decrease carrier lifetime. A first InP defect layer 110 contains slowly diffusing vacancy defects 114, while a second InP defect layer 112 includes rapidly diffusing group V interstitial defects 116. Rapid thermal annealing causes both types of defects to diffuse into the quantum well active region.

However, the above-noted problem of the demultiplexing photodetector has not yet been solved.

SUMMARY OF THE INVENTION

It will be readily apparent from the above that a need exists in the art for a compact, inexpensive demultiplexing photodetector. It is therefore an object of the present invention to provide a demultiplexing photodetector in a single semiconductor structure. It is another object of the invention to provide an inexpensive manufacturing technique for such a photodetector.

To achieve the above and other objects, the present invention is directed to a photodetector in which multiple wavelength detecting regions are integrated into a monolithic semiconductor structure, as well as to a method of making such a photodetector using the technique described above or any other suitable intermixing technique. The photodetector uses the above-described techniques to provide multiple photodetecting regions and thus to provide an integrated serial single-waveguide ultra-broadband photodetector. The invention exploits the above-described technique to shift the absorption edge locally. A waveguide is used to carry the light along the length of the device. All materials can be grown semi-insulating and on a semi-insulating substrate to achieve electrical isolation between different wavelength-detecting regions. The length of the device and thus the bandgap grading length achieved by intermixing are chosen so that all high-energy photons are absorbed in the early absorption regions. Wavelength-resolving capability then given approximately by:

grading rate ($\mu$m per $\mu$m)/(loss in microns).

For 2000 cm$^{-1}$, hence 0.2 $\mu$m$^{-1}$, a spatial grading rate of $10^{-4}$ $\mu$m/$\mu$m would give a resolution of about $5 \times 10^{-4}$ $\mu$m, or about 0.5 nm. This device could demultiplex and detect the entire spectrum 1.3–1.6 $\mu$m (hence 0.3 $\mu$m of bandwidth) in a device length of 600 $\mu$m, hence less than 1 mm. Achieving this resolution will depend on the sharpness of the local spectra of the photoconductive materials and on the sophistication of electronic signal-processing capabilities. Nonlinearity in grading or other properties may be precisely compensated using reciprocally nonlinear variable contact spacing.

BRIEF DESCRIPTION OF THE DRAWINGS

A preferred embodiment of the present invention will be set forth in detail with reference to the drawings, in which.

DETAILED DESCRIPTION OF THE PREFERRED EMBODIMENTS

Figure 1A:
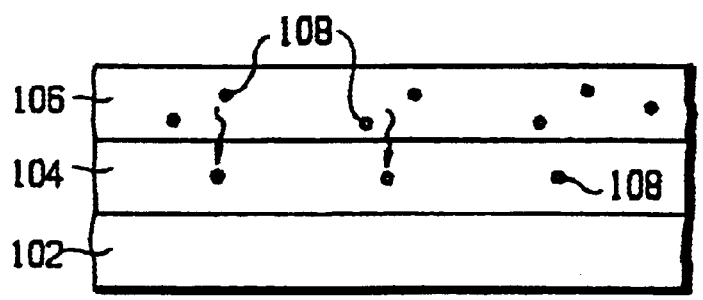
FIGS. 1A and 1B show two embodiments of the technique of the above-cited Thompson et al patent application.
Figure 1B:
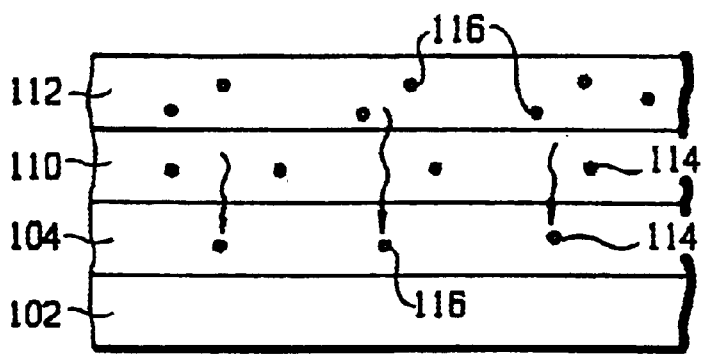

A preferred embodiment of the present invention will be set forth in detail with reference to the drawings, in which like reference numerals refer to like elements or operational steps throughout.

Figure 2:
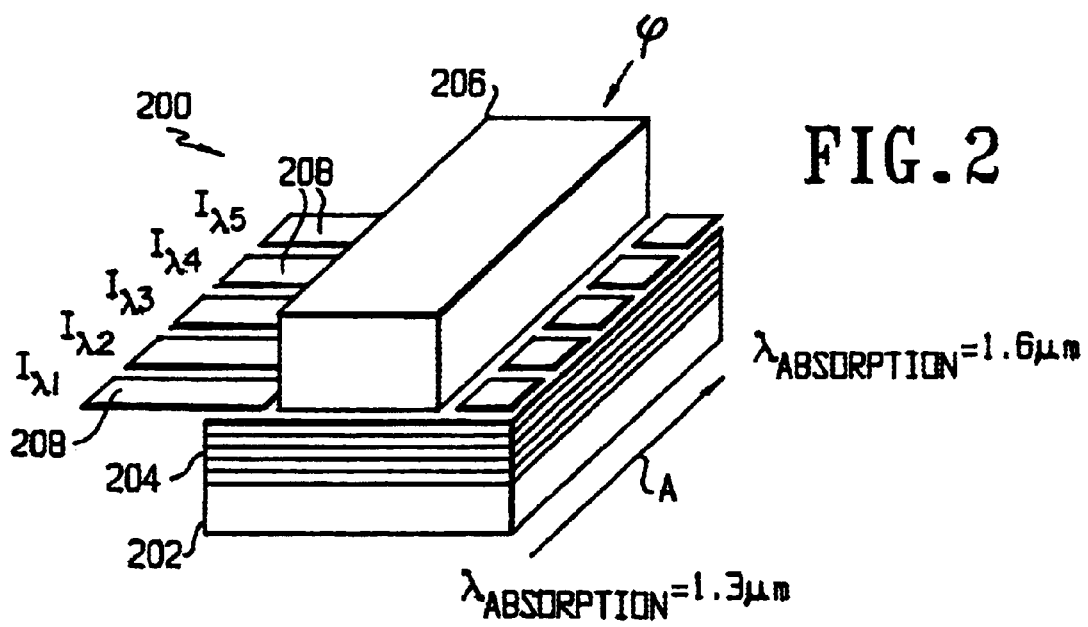
FIG. 2 shows a schematic diagram of a demultiplexing photodetector according to the preferred embodiment.

FIG. 2 shows a single-waveguide integrated wavelength demux-photodetector for low-cost access applications. The photodetector 200 uses a unipolar photoconductive waveguided one-dimensional optoelectronic switch array.

A Si-InP substrate 202 supports a quantum well structure 204. The quantum well structure 204 is characterized by a stepwise tuned composition, quantum well thickness, or both to achieve an absorption spectrum which varies along the axis A. Alternatively, the composition, the quantum well thickness, or both could be tuned continuously. In the preferred embodiment, the absorption wavelength $\lambda_{absorption}$ varies from a minimum value of 1.3 μm to a maximum value of 1.6 μm, thus providing a bandwidth of 0.3 μm.

The quantum well structure 204 thus acts as a photodetector for a wavelength which varies stepwise along the quantum well structure 204 In the specific embodiment of FIG. 2, there are five such steps, although, of course, the number could be varied as needed. An incoming optical signal φ, whose intensity is a function φ(λ) of wavelength, is applied to the quantum well structure 204 through a single-mode waveguide 206. The quantum well structure 204 receives the incoming optical signal φ and outputs an electrical signal which varies along the length of the quantum well structure 204 in accordance with the value of φ(λ) for each λ.

Five (or another suitable number) electrodes 208 are applied along the quantum well structure 204. Each of the electrodes 208 receives the signal output from the quantum well structure 204 for a corresponding wavelength $\lambda_1$, $\lambda_2$, $\lambda_3$, $\lambda_4$, or $\lambda_5$ and outputs a signal represented by a corresponding current $I_{\lambda 1}$, $I_{\lambda 2}$, $I_{\lambda 3}$, $I_{\lambda 4}$ or $I_{\lambda 5}$. The electrodes 208 are connected by leads (not shown) to electronic signal processing circuitry (not shown) to process the output for the various wavelengths.

The photodetector 200 can produce usable signals corresponding to five wavelengths $\lambda_1$, $\lambda_2$, $\lambda_3$, $\lambda_4$, and $\lambda_5$ and can thus resolve five channels from the incoming optical signal φ. Of course, the photodetector 200 could be easily modified to resolve more or fewer channels.

The quantum well structure can be fabricated by any of the techniques of the Thompson et al patent application cited above or by any other suitable intermixing techniques.

Figure 3A:
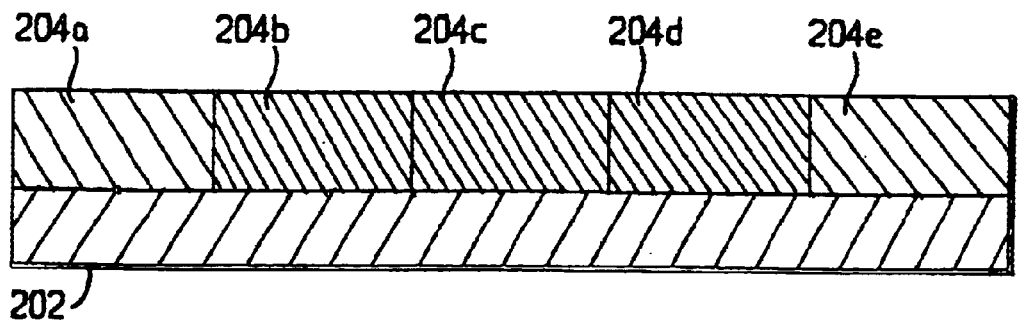
FIGS. 3A and 3B show different techniques for varying the wavelength absorption spectrum of different locations within the quantum well structure of FIG. 2.
Figure 3B:
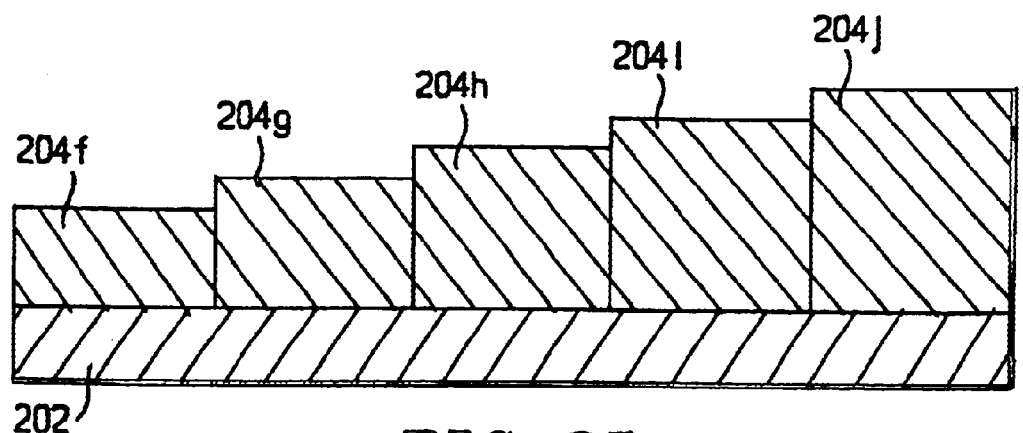

As noted above, the quantum well structure 204 can have its wavelength absorption spectrum tuned in various ways. For example, as shown in FIG. 3A, the quantum well structure can be formed as five locations 204a, 204b, 204c, 204d, 204e having different compositions. Alternatively, as shown in FIG. 3B, the five locations 204f, 204g, 204h, 204i, 204j can have different thicknesses. Of course, those techniques could be combined, and either or both could be implemented using the techniques of the above-cited Thompson et al patent application.

The geometry of propagation of the incoming optical signal φ is shown in FIG. 2. It is seen in that figure that the optical signal φ propagates in a planar manner relative to the quantum well structure 204. It is also seen that since the absorption wavelength $\lambda_{absorption}$ varies along the axis A, the regions of the quantum well structure 204 receptive to the various wavelengths $\lambda_1$, $\lambda_2$, $\lambda_3$, $\lambda_4$, and $\lambda_5$ are exposed to the optical signal φ in series.

While a preferred embodiment and two variations have been set forth above, those skilled in the art who have reviewed the present disclosure will readily appreciate that other embodiments can be realized within the scope of the invention. For example, any suitable waveguide or configuration of electrodes could be used. Therefore, the present invention should be construed as limited only by the appended claims.

What is claimed is:

1. A photodetector for receiving light having a plurality of wavelengths and an intensity at each of the plurality of wavelengths and for outputting a plurality of signals, each signal representing the intensity at one of the plurality of wavelengths, the photodetector comprising:
   a semiconductor quantum well structure having a quantum well active region whose effective bandgap properties are modified so as to vary spatially within the quantum well active region, such that the quantum well active region has a light absorption spectrum which varies spatially within the quantum well active region to define a plurality of locations corresponding to the plurality of wavelengths;
   a waveguide for coupling the light to the plurality of locations within the quantum well active region such that the plurality of locations absorb the light at the plurality of wavelengths and output the plurality of signals; and
   a plurality of electrodes, one in electrical contact with each of the plurality of locations, for receiving the plurality of signals and for outputting the plurality of signals from the photodetector.

2. The photodetector of claim 1, wherein the bandgap properties vary stepwise, such that the plurality of locations are defined discretely within the quantum well active region.

3. The photodetector of claim 1, wherein the bandgap properties vary in accordance with a spatial variation in a composition of the quantum well active region.

4. The photodetector of claim 1, wherein the bandgap properties vary in accordance with a spatial variation in a thickness of the quantum well active region.

5. The photodetector of claim 1, wherein the plurality of wavelengths comprises wavelengths in a range from 1.3 μm to 1.6 μm.

6. The photodetector of claim 1, wherein the quantum well active region is an indium gallium arsenide phosphide (InGaAsP) quantum well active region.

7. A method of making a photodetector for receiving light having a plurality of wavelengths and an intensity at each of the plurality of wavelengths and for outputting a plurality of signals, each signal representing the intensity at one of the plurality of wavelengths, the method comprising:
   (a) forming, in a semiconductor quantum well structure, a quantum well active region;
   (b) modifying effective bandgap properties in the quantum well active region so that the effective bandgap properties vary spatially within the quantum well active region, such that the quantum well active region has a light absorption spectrum which varies spatially within the quantum well active region to define a plurality of locations corresponding to the plurality of wavelengths;
   (c) providing a waveguide on the semiconductor quantum well structure for coupling the light to the plurality of locations within the quantum well active region such that the plurality of locations absorb the light at the plurality of wavelengths and output the plurality of signals; and
   (d) providing a plurality of electrodes and placing each of the plurality of electrodes in electrical contact with each of the plurality of locations, for receiving the plurality of signals and for outputting the plurality of signals from the photodetector.

8. The method of claim 7, wherein step (b) comprises modifying the bandgap properties to vary stepwise, such that the plurality of locations are defined discretely within the quantum well active region.

9. The method of claim 7, wherein step (b) comprises modifying the bandgap properties by spatially varying a spatial variation in a composition of the quantum well active region.

10. The method of claim 7, wherein step (b) comprises modifying the bandgap properties by spatially varying a thickness of the quantum well active region.

11. The method of claim 7, wherein the plurality of wavelengths comprises wavelengths in a range from 1.3 μm to 1.6 μm.

12. The method of claim 7, wherein the quantum well active region is an indium gallium arsenide phosphide (InGaAsP) quantum well active region.

13. The method of claim 12, wherein step (b) comprises rapid thermal annealing for controlled diffusion of defects into the quantum well active region.

14. The method of claim 13, wherein step (b) comprises:
  (i) on top of the semiconductor quantum well structure, providing a first indium phosphide (InP) layer with vacancy type defects, wherein the vacancy type defects act as slow diffusers;
  (ii) on top of the first InP layer, providing a second InP layer with interstitial type defects, wherein the interstitial type defects act as fast diffusers; and
  (iii) applying a rapid thermal annealing process to the semiconductor quantum well structure for controlled diffusion of the vacancy type defects and the interstitial type defects into the quantum well active region.

15. The method of claim 13, wherein step (b) comprises:
  (i) on top of the semiconductor quantum well structure, providing an indium phosphide (InP) layer with point defects, wherein the point defects are donor-like phosphorus antisites or acceptor-like indium vacancies; and
  (ii) applying a rapid thermal annealing process for controlled diffusion of the point defects into the quantum well active region.

16. The photodetector of claim 1, wherein the waveguide is configured for coupling the light to the plurality of locations within the quantum well active region such that the light propagates in a planar manner relative to the quantum well structure.

17. The photodetector of claim 16, wherein the waveguide is disposed relative to the plurality of locations such that the waveguide couples the light to the plurality of locations in series.

18. The method of claim 7, wherein step (c) comprises providing the waveguide for coupling the light to the plurality of locations within the quantum well active region such that the light propagates in a planar manner relative to the quantum well structure.

19. The method of claim 18, wherein step (c) comprises disposing the waveguide relative to the plurality of locations such that the waveguide couples the light to the plurality of locations in series.

* * * * *